(12) United States Patent  
Stahel et al.

(10) Patent No.: US 11,967,890 B2  
(45) Date of Patent: Apr. 23, 2024

(54) FREQUENCY CONVERTER

(71) Applicant: Lenze SE, Aerzen (DE)

(72) Inventors: Robin Stahel, Aadorf (CH); Andreas Burgermeister, Mauren (CH)

(73) Assignee: Lenze SE, Aerzen (DE)

( * ) Notice: Subject to any disclaimer, the term of this patent is extended or adjusted under 35 U.S.C. 154(b) by 583 days.

(21) Appl. No.: 17/268,772

(22) PCT Filed: Aug. 7, 2019

(86) PCT No.: PCT/EP2019/071271  
§ 371 (c)(1),  
(2) Date: Sep. 9, 2021

(87) PCT Pub. No.: WO2020/035381  
PCT Pub. Date: Feb. 20, 2020

(65) Prior Publication Data  
US 2021/0399632 A1 Dec. 23, 2021

(30) Foreign Application Priority Data

Aug. 13, 2018 (DE) ...................... 10 2018 213 623.8

(51) Int. Cl.  
*H02M 1/00* (2006.01)  
*H02M 5/297* (2006.01)

(52) U.S. Cl.  
CPC ......... *H02M 1/0009* (2021.05); *H02M 5/297* (2013.01)

(58) Field of Classification Search  
CPC ............................ H02M 1/0009; H02M 5/297  
See application file for complete search history.

(56) References Cited

U.S. PATENT DOCUMENTS

| 4,656,554 A | 4/1987 | Maschek et al. |
| 9,431,933 B2 | 8/2016 | Takami et al. |
| 2009/0132188 A1* | 5/2009 | Watanabe .......... G01R 31/2829 702/64 |
| 2010/0315024 A1 | 12/2010 | Najima et al. |

(Continued)

FOREIGN PATENT DOCUMENTS

| DE | 23 52 493 A1 | 4/1975 |
| DE | 199 05 839 A1 | 8/2000 |

(Continued)

OTHER PUBLICATIONS

International Search Report (PCT/ISA/210) issued in PCT Application No. PCT/EP2019/071271 dated Oct. 4, 2019 with English translation (six (6) pages).

(Continued)

*Primary Examiner* — Jue Zhang  
(74) *Attorney, Agent, or Firm* — Crowell & Moring LLP

(57) ABSTRACT

A frequency converter includes: at least one bridge arm, wherein a shunt resistor is arranged in the bridge arm; an evaluation device having an input connection, the evaluation device being designed to evaluate a measurement signal which is present at the input connection and which is dependent on a voltage drop across the shunt resistor, in order to determine a measured variable; and a voltage peak suppression device, which is designed to short-circuit the input connection of the evaluation device when a voltage peak occurs at the shunt resistor.

4 Claims, 1 Drawing Sheet

(56) References Cited

U.S. PATENT DOCUMENTS

2015/0207438 A1* 7/2015 Takami .................. H02P 6/28
                                                    318/400.06
2015/0372594 A1   12/2015 Mednik et al.
2016/0319797 A1* 11/2016 Reimann ................. F02P 3/04

FOREIGN PATENT DOCUMENTS

| DE | 100 46 393 A1     | 3/2002 |
| DE | 10 2010 040 174 A1 | 3/2012 |
| DE | 10 2015 100 759 A1 | 7/2015 |
| DE | 10 2016 217 874 A1 | 3/2018 |
| DE | 10 2016 222 754 A1 | 5/2018 |
| EP | 2 200 141 A1      | 6/2010 |
| JP | 2000-194456 A     | 7/2000 |

OTHER PUBLICATIONS

German-language Written Opinion (PCT/ISA/237) issued in PCT Application No. PCT/EP2019/071271 dated Oct. 4, 2019 (six (6) pages).

German-language Office Action issued in German Application No. 10 2018 213 623.8 dated Apr. 1, 2019 (nine (9) pages).

* cited by examiner

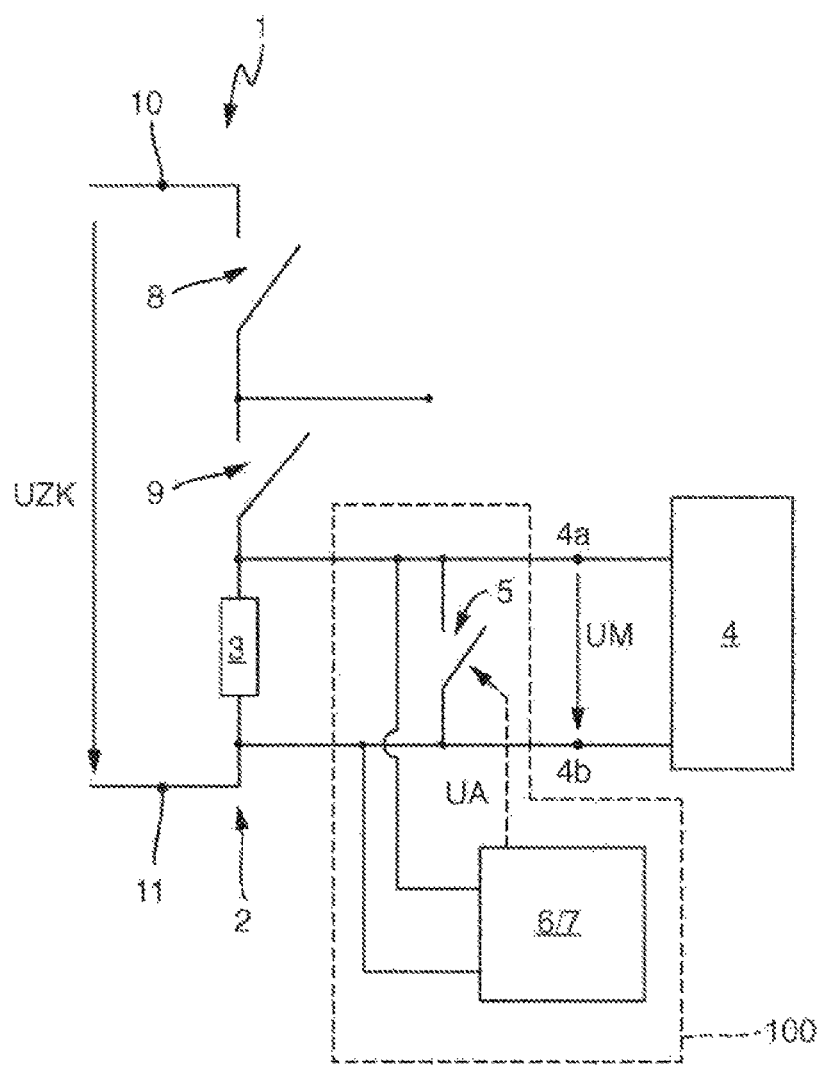

FREQUENCY CONVERTER

BACKGROUND AND SUMMARY OF THE INVENTION

The invention relates to a frequency converter.

In the case of the so-called emitter shunt current measurement for measuring motor currents, which can be used in frequency converters, a shunt resistor is arranged in at least one bridge arm of the frequency converter. In this respect, reference is also made to the relevant technical literature.

The invention is based on the object of providing a frequency converter which enables a simple, reliable and cost-effective emitter shunt current measurement.

The invention achieves this object by device of a frequency converter according to the independent claim.

The frequency converter conventionally has at least one bridge arm, wherein a shunt resistor which can be used, in particular, to measure the motor current is arranged in the bridge arm. The frequency converter may have three bridge arms, in particular, wherein a respective shunt resistor is arranged in at least two bridge arms. In this respect, reference is also made to the relevant technical literature.

The frequency converter also has an evaluation device having an input connection, wherein the evaluation device is designed to evaluate a measurement signal, which is present at the input connection and is dependent on a voltage drop across the shunt resistor, in order to determine a measurement variable. The measurement signal may be a voltage. The measurement signal may be identical to the voltage drop across the shunt resistor. The measurement variable may be, for example, a motor current or a current into an associated phase of an electric motor.

The frequency converter also has a voltage peak suppression device which is designed to short-circuit the input connection of the evaluation device if a voltage peak occurs at the shunt resistor. The voltage peak suppression device may be designed to short-circuit the input connection of the evaluation device for a predetermined period or until a predefined voltage level has been established if the voltage peak occurs at the shunt resistor. The predefined period may be between 2 μs and 10 μs, for example.

According to one embodiment, the voltage peak suppression device has at least one switching device which is looped in between the input connection of the evaluation device and is controlled by device of a control signal, wherein the switching device short-circuits or does not short-circuit the input connection of the evaluation device on the basis of a state of the control signal. For example, the switching device may be embodied in the form of a PNP transistor and an NPN transistor connected in parallel in order to enable leakage currents or short-circuit currents in two directions. As an alternative to the bipolar transistors, it goes without saying that it is also possible to use a MOSFET as the switching device, for example.

According to one embodiment, the voltage peak suppression device has a high-pass filter which generates the control signal on the basis of the voltage drop across the shunt resistor. The high-pass filter should be dimensioned in such a manner that, for the typical levels of the voltage peaks, the typical rise times of the voltage peaks and/or the typical durations of the voltage peaks, the control signal is generated in such a manner that the voltage peaks are effectively suppressed or temporally masked by device of short-circuiting.

According to one embodiment, the voltage peak suppression device has a monostable flip-flop which generates the control signal on the basis of the voltage drop across the shunt resistor. For example, the monostable flip-flop can be triggered by the voltage peak and can generate the control signal in such a manner that the input connection of the evaluation device is short-circuited for a predefined period. The predefined period may be between 2 μs and 10 μs, for example.

According to one embodiment, the voltage peak suppression device is designed to short-circuit the input connection of the evaluation device if the voltage peak or an underlying voltage profile at the shunt resistor has the following properties: the voltage across the shunt resistor has a level which is greater than 1 V, and/or a rise time of the voltage across the shunt resistor to a predefined level, for example 1 V, is less than 100 ns, and/or a duration, during which the voltage across the shunt resistor is greater than a threshold value, for example 1 V, is less than 500 ns.

According to one embodiment, the bridge arm has a first controllable switching device and a second controllable switching device, wherein the first controllable switching device, the second controllable switching device and the shunt resistor are looped-in in series between a first intermediate circuit pole and a second intermediate circuit pole, wherein an intermediate circuit voltage is present between the first intermediate circuit pole and the second intermediate circuit pole.

In the case of the emitter shunt current measurement, the motor currents are each measured only at the lower switching device of the respective bridge arms. As a result, the measurement current through the shunt resistor is pulsed. By virtue of the resulting inductance of the shunt resistor and of associated conductor tracks, a voltage peak arises during the switching-on operation. This voltage peak cannot be removed by device of a simple low-pass filter since the voltage peak is not symmetrical. A further reason is that it is also necessary to measure very narrow pulses, for example with a duration of <10 μs in the case of underlying pulse width modulation at 16 kHz.

Using the example of a frequency converter for 400 VAC and a typical edge steepness of 100 ns (corresponds to 5.6 kV/μs), the switching device or the IGBT of a respective bridge arm must drive very high switching currents in the case of long motor cables (>20 m). As a result, a high voltage is dropped across the shunt resistor and is significantly increased again by the inductance thereof. An amplitude of a voltage peak when switching on the lower switching device of the bridge arm is considerably greater than a level of the actual measurement signal. This causes severe distortions and oscillations of the measurement signal. The measured value is typically stable only after approximately 10 μs. Such settling times cannot be tolerated at switching frequencies of pulse width modulation of greater than 6 kHz.

According to the invention, the voltage peak caused by switching on the lower switching device of the bridge arm is now temporally masked. For this purpose, use is made of a switching device, for example in the form of one or more transistors, which short-circuits the signal or measurement signal to be evaluated during a predefined duration. A control signal for the switching device can be generated by device of a high-pass filter, for example. As soon as a voltage peak of approximately 1 V occurs across the shunt resistor (including the conductor track), for example, the switching device short-circuits the measurement signal. If the voltage peak caused by the inductance has decayed, the switching device is opened, with the result that the measurement signal is present at the evaluation device.

According to the invention, interfering pulses caused by the inductance are consequently temporally masked. This results in the following advantages:
- higher current measurement accuracy (in existing circuits),
- low-value shunt resistor possible (less power loss),
- shunt resistor can be arranged on a circuit board as an SMD component without cooling (in frequency converters up to at least 22 kW/400 V),
- cost-effective since shunt resistors can be used instead of current transformers, reduced sensitivity to interference,
- emitter shunt current measurement also possible with future technologies (very fast power semiconductors).

The invention is described in detail below with reference to the drawing.

BRIEF DESCRIPTION OF THE DRAWING

FIG. 1 is a highly schematic block diagram of a frequency converter according to an embodiment of the invention.

DETAILED DESCRIPTION OF THE DRAWING

FIG. 1 shows a highly schematic block diagram of a frequency converter 1. The frequency converter 1 has a total of three bridge arms 2, in which case only a single bridge arm 2 is illustrated by way of example. Two controllable switching device 8 and 9, for example in the form of IGBTs, and a shunt resistor 3 are conventionally arranged in the bridge arm 2, wherein an intermediate circuit voltage UZK is applied to the bridge arm 2. A connecting point of the two controllable switching device 8 and 9 conventionally forms a phase connection for an electric motor which is not illustrated. The first controllable switching device 8, the second controllable switching device 9 and the shunt resistor 3 are looped-in in series between a first intermediate circuit pole 10 and a second intermediate circuit pole 11, wherein the intermediate circuit voltage UZK is present between the two intermediate circuit poles 10 and 11. In this respect, reference is also made to the relevant technical literature.

The frequency converter 1 also has an evaluation device 4 having an input connection with two input connection poles 4a and 4b, wherein the evaluation device 4 is designed to evaluate a measurement signal in the form of a measurement voltage UM, which is present at the input connection or the input connection poles 4a and 4b, in order to determine a measurement variable in the form of a motor current or a motor current measured value. The measurement voltage UM corresponds to the voltage drop across the shunt resistor 3. The evaluation device 4 may be in the form of a microprocessor, for example.

The frequency converter 1 also has a voltage peak suppression device 100 having components 5, 6, 7, wherein the voltage peak suppression device 100 and/or its components 5, 6, 7 is/are designed to short-circuit the input connection or the input connection poles 4a, 4b of the evaluation device 4 if a voltage peak occurs at the shunt resistor 3, that is to say a voltage peak of the measurement voltage UM, in order to mask the voltage peak.

The voltage peak suppression device 100 has a controllable switching device 5 which is looped-in between the input connection or the input connection poles 4a and 4b of the evaluation device 4 and is controlled by device of a control signal UA. The controllable switching device 5 may be formed, for example, by two transistors, for example an NPN transistor and a PNP transistor connected in parallel. The switching device 5 short-circuits or does not short-circuit the input connection or the input connection poles 4a and 4b of the evaluation device 4 on the basis of a state of the control signal UA.

The voltage peak suppression device 100 also has, for example, a high-pass filter 6 which generates the control signal UA on the basis of the voltage drop across the shunt resistor 3 or a temporal profile of the measurement voltage UM in such a manner that the switching device 5 is closed for approximately 2 µs and is then opened again in the event of a voltage peak of the measurement voltage UM.

As an alternative or in addition to the high-pass filter 6, the voltage peak suppression device 100 may have a monostable flip-flop 7 which suitably generates the control signal UA on the basis of the voltage drop across the shunt resistor 3 or the measurement voltage UM.

A voltage peak at the shunt resistor 3 or of the measurement voltage UM typically complies with the following definition: the voltage peak has a voltage level which is greater than 1 V, and/or the voltage peak has a rise time to 1 V of less than 100 ns, and/or the voltage peak has a duration with a voltage level of typically greater than 1 V of less than 500 ns.

The invention claimed is:

1. A frequency converter, comprising:
   at least one bridge arm;
   a shunt resistor arranged in the at least one bridge arm;
   an evaluation device having an input connection, wherein the evaluation device is designed to evaluate a measurement signal, which is present at the input connection and is dependent on a voltage drop across the shunt resistor, in order to determine a measurement variable; and
   a voltage peak suppression device which is designed to short-circuit the input connection of the evaluation device when a voltage peak occurs at the shunt resistor, wherein the voltage peak suppression device comprises:
      at least one switching device which is looped-in between the input connection of the evaluation device and is controlled via a control signal, wherein the switching device short-circuits the input connection of the evaluation device based on a state of the control signal, and
      a high-pass filter which generates the control signal based on the voltage drop across the shunt resistor.

2. The frequency converter according to claim 1, wherein the voltage peak suppression device further comprises:
   a monostable flip-flop which generates the control signal based on the voltage drop across the shunt resistor.

3. The frequency converter according to claim 1, wherein the voltage peak suppression device is designed to short-circuit the input connection of the evaluation device when the voltage peak at the shunt resistor has at least one of the following properties:
   a level which is greater than 1 V,
   a rise time of less than 100 ns, or
   a duration of less than 500 ns.

4. The frequency converter according to claim 1, wherein the at least one bridge arm has a first controllable switching device and a second controllable switching device, and
   the first controllable switching device, the second controllable switching device and the shunt resistor are looped-in in series between a first intermediate circuit pole and a second intermediate circuit pole.

* * * * *